United States Patent
Neal et al.

(10) Patent No.: US 10,106,882 B2
(45) Date of Patent: Oct. 23, 2018

(54) METHOD OF FORMING A MULTI-LAYERED COATING WITH COLUMNAR MICROSTRUCTURE AND BRANCHED COLUMNAR MICROSTRUCTURE

(71) Applicant: United Technologies Corporation, Hartford, CT (US)

(72) Inventors: James W. Neal, Ellington, CT (US); Michael J. Maloney, Marlborough, CT (US); Kevin W. Schlichting, South Glastonbury, CT (US); Eric Jorzik, Danbury, CT (US); David A. Litton, West Hartford, CT (US); Brian T. Hazel, Avon, CT (US)

(73) Assignee: UNITED TECHNOLOGIES CORPORATION, Farmington, CT (US)

( * ) Notice: Subject to any disclaimer, the term of this patent is extended or adjusted under 35 U.S.C. 154(b) by 628 days.

(21) Appl. No.: 14/880,861

(22) Filed: Oct. 12, 2015

(65) Prior Publication Data
US 2017/0101709 A1    Apr. 13, 2017

(51) Int. Cl.
| | |
|---|---|
| *C23C 14/24* | (2006.01) |
| *C23C 14/30* | (2006.01) |
| *C23C 14/08* | (2006.01) |
| *F01D 25/00* | (2006.01) |
| *F01D 25/28* | (2006.01) |

(Continued)

(52) U.S. Cl.
CPC .......... *C23C 14/30* (2013.01); *C23C 14/0021* (2013.01); *C23C 14/083* (2013.01); *F01D 25/005* (2013.01); *F01D 25/28* (2013.01); *F01D 5/288* (2013.01); *F05D 2230/31* (2013.01); *F05D 2300/611* (2013.01)

(58) Field of Classification Search
CPC ..... C23C 14/30; C23C 14/083; C23C 16/487; C23C 16/40; C23C 14/24
See application file for complete search history.

(56) References Cited

U.S. PATENT DOCUMENTS

| | | |
|---|---|---|
| 2003/0118874 A1 | 6/2003 | Murphy |
| 2005/0112412 A1 | 5/2005 | Darolia et al. |

(Continued)

FOREIGN PATENT DOCUMENTS

| | | |
|---|---|---|
| EP | 0969117 A2 | 1/2000 |

OTHER PUBLICATIONS

Beele, W., et al., "The evolution of thermal barrier coatings—status and upcoming solutions for today's key issues". Surface and Coatings Technology 120-121 (1999) 61-67.*

(Continued)

*Primary Examiner* — Bret P Chen
(74) *Attorney, Agent, or Firm* — Carlson, Gaskey & Olds, P.C.

(57) ABSTRACT

A method includes forming a multi-layered ceramic barrier coating under a chamber pressure of greater than 1 Pascals. In the method, low- and high-dopant ceramic materials are evaporated using input evaporating energies that fall, respectively, above and below a threshold for depositing the materials in a columnar microstructure (low-dopant) and in a branched columnar microstructure (high-dopant).

20 Claims, 3 Drawing Sheets

(51) Int. Cl.
 *C23C 14/00* (2006.01)
 *F01D 5/28* (2006.01)

(56) References Cited

U.S. PATENT DOCUMENTS

| | | | |
|---|---|---|---|
| 2006/0222922 A1* | 10/2006 | Murphy | C23C 14/02 |
| | | | 429/495 |
| 2008/0145674 A1* | 6/2008 | Darolia | F01D 5/288 |
| | | | 428/433 |
| 2010/0189929 A1* | 7/2010 | Neal | C23C 14/228 |
| | | | 427/585 |

OTHER PUBLICATIONS

Mogro-Campero, A., et al., "Effect of gas pressure on thermal conductivity of zirconia thermal barrier coatings". Surface and Coatings Technology 94-95 (1997) 102-105.*

Schulz, U., et al., "Improvement of EB-PVD thermal barrier coatings by treatments of a vacuum plasma-sprayed bond coat". Surface and Coatings Technology 203 (2008) 160-170.*

Schmitt, Michael P., et al., "Multilayer thermal barrier coating (TBC) architectures utilizing rare earth doped YSZ and rare earth pyrochlores". Surface and Coatings Technology 251 (2014) 56-63.*

European Search Report for European Patent Application No. 16192795.9 completed Mar. 15, 2017.

* cited by examiner

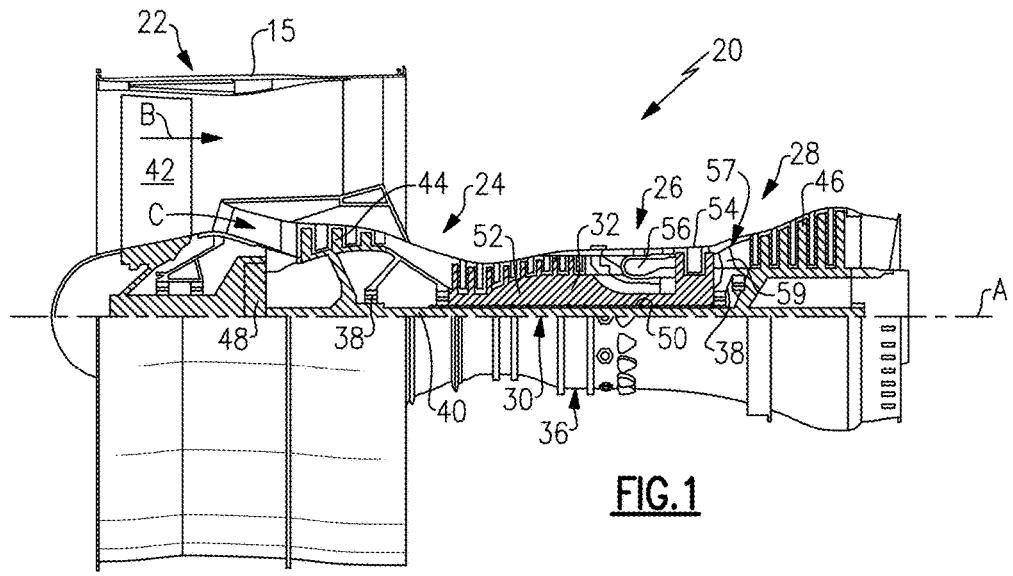
FIG.1
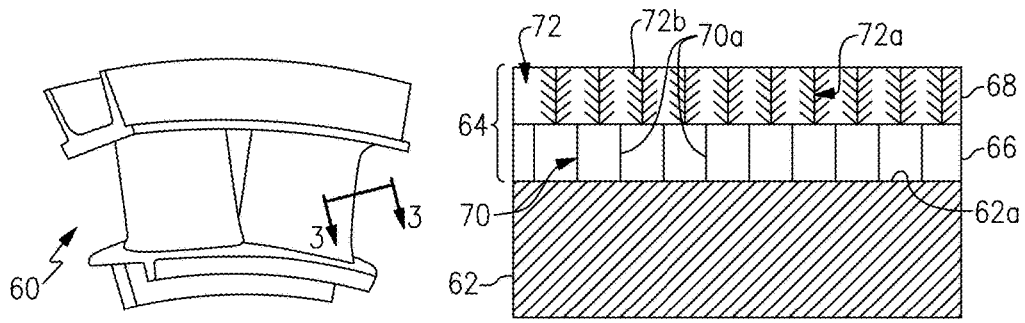
FIG.2
FIG.3A
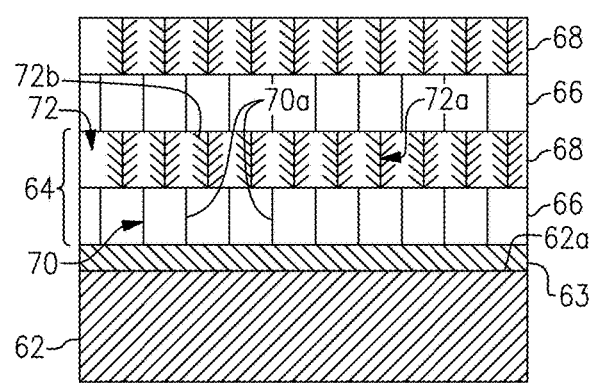
FIG.3B

METHOD OF FORMING A MULTI-LAYERED COATING WITH COLUMNAR MICROSTRUCTURE AND BRANCHED COLUMNAR MICROSTRUCTURE

BACKGROUND

A gas turbine engine typically includes a fan section, a compressor section, a combustor section and a turbine section. Air entering the compressor section is compressed and delivered into the combustion section where it is mixed with fuel and ignited to generate a high-speed exhaust gas flow. The high-speed exhaust gas flow expands through the turbine section to drive the compressor and the fan section. The compressor section typically includes low and high pressure compressors, and the turbine section includes low and high pressure turbines.

Components in the engine that are exposed to relatively severe conditions, such as corrosive conditions and high-temperature conditions, can include a barrier coating. One type of barrier coating is a ceramic barrier coating, such as yttria stabilized zirconia.

SUMMARY

A method of forming a multi-layered ceramic barrier coating according to an example of the present disclosure includes, under a chamber pressure of greater than 1 Pascals, evaporating a low-dopant ceramic material using a first input evaporating energy that is above a threshold for depositing the low-dopant ceramic material in a low-dopant ceramic columnar microstructure versus a low-dopant ceramic branched columnar microstructure. The evaporated low-dopant ceramic material is deposited on a substrate as a first layer that has the low-dopant ceramic columnar microstructure, and under the chamber pressure of greater than 1 Pascal, evaporating a high-dopant ceramic material using a second input evaporating energy that is below a threshold for depositing the high-dopant ceramic material in a high-dopant ceramic columnar microstructure versus a high-dopant ceramic branched columnar microstructure. The evaporated high-dopant ceramic material is deposited on the substrate as a second layer that has the high-dopant ceramic branched columnar microstructure.

In a further embodiment of any of the forgoing embodiments, the evaporating of the low-dopant ceramic material includes modulating a first percentage of an electron beam power that is on a pool of the low-dopant ceramic material to produce the first input evaporating energy, and the evaporating of the high-dopant ceramic material includes modulating a second percentage of the electron beam power that is on a pool of the high-dopant ceramic material to produce the second input evaporating energy.

In a further embodiment of any of the forgoing embodiments, the modulating of the first percentage and the modulating of the second percentage include adjusting an electron beam focus and an electron beam pattern zoom.

In a further embodiment of any of the forgoing embodiments, the adjusting includes producing an electron beam footprint, and for the evaporating of the low-dopant ceramic material, partially overlapping the electron beam footprint with the pool of the low-dopant ceramic material by an amount that corresponds to the first percentage, and for the evaporating of the high-dopant ceramic material, partially overlapping the electron beam footprint with the pool of the high-dopant ceramic material by an amount that corresponds to the second percentage.

In a further embodiment of any of the forgoing embodiments, the first percentage and the second percentage are equal.

A further embodiment of any of the foregoing embodiments includes controlling the first input evaporating energy and the second input evaporating energy with respect to process temperature.

In a further embodiment of any of the forgoing embodiments, the chamber pressure is 3-15 Pascals.

In a further embodiment of any of the forgoing embodiments, the chamber pressure and a process temperature are constant for evaporating the low-dopant ceramic material and evaporating the high-dopant ceramic material.

In a further embodiment of any of the forgoing embodiments, the low-dopant ceramic material and the high-dopant ceramic material are oxides that are independently doped with elements selected from the group consisting of rare earth elements.

In a further embodiment of any of the forgoing embodiments, the substrate is a substrate of a gas turbine engine component.

A method of forming a multi-layered ceramic barrier coating according to an example of the present disclosure includes using a common set of electron beam physical vapor deposition input parameters that at least includes common electron beam power and common chamber pressure of greater than 1 Pascals, and evaporating a low-dopant ceramic material and depositing the evaporated low-dopant ceramic material on a substrate. The common set of electron beam physical vapor deposition input parameters effectuate deposition of the low-dopant ceramic material in a columnar microstructure, followed by, evaporating a high-dopant ceramic material and depositing the evaporated high-dopant ceramic material on the substrate. The common set of electron beam physical vapor deposition input parameters effectuate deposition of the high-dopant ceramic material in a branched columnar microstructure.

In a further embodiment of any of the forgoing embodiments, the low-dopant ceramic material and the high-dopant ceramic material are independently doped with elements selected from the group consisting of rare earth elements.

In a further embodiment of any of the forgoing embodiments, the low-dopant ceramic material and the high-dopant ceramic material each include zirconium.

In a further embodiment of any of the forgoing embodiments, the low-dopant ceramic material includes yttrium and the high-dopant ceramic material includes gadolinium.

In a further embodiment of any of the forgoing embodiments, the low-dopant ceramic material is yttria stabilized zirconia and the high-dopant ceramic material is gadolinia stabilized zirconia.

In a further embodiment of any of the forgoing embodiments, the substrate is a substrate of a gas turbine engine component.

A further embodiment of any of the foregoing embodiments includes comprising applying a bond coating to at least one of the substrate, the low-dopant ceramic material, or the high-dopant ceramic material.

A method of forming a multi-layered ceramic barrier coating according to an example of the present disclosure includes, under a chamber pressure of greater than 1 Pascals, evaporating a first ceramic material above a first temperature-pressure threshold for depositing the first ceramic material in a first columnar microstructure versus a first branched columnar microstructure. The evaporated first ceramic material is deposited on a substrate as a first layer that has the first columnar microstructure, and under the chamber pressure of greater than 1 Pascal, evaporating a second ceramic material below a second temperature-pressure threshold for depositing the second ceramic material in a second columnar microstructure versus a second branched columnar microstructure. The second ceramic material differs from the first ceramic material in composition and the evaporated second ceramic material is deposited on the substrate as a second layer that has the second branched columnar microstructure.

In a further embodiment of any of the forgoing embodiments, the first ceramic material and the second ceramic material are oxides that are independently doped with elements selected from the group consisting of rare earth elements.

In a further embodiment of any of the forgoing embodiments, the oxides are selected from the group consisting of zirconia and hafnia.

BRIEF DESCRIPTION OF THE DRAWINGS

The various features and advantages of the present disclosure will become apparent to those skilled in the art from the following detailed description. The drawings that accompany the detailed description can be briefly described as follows.

FIG. 1 illustrates an example gas turbine engine.

FIG. 2 illustrates an example article that can be used in the gas turbine engine of FIG. 1.

FIG. 3A illustrates a representative cross-section of an article having a multi-layered coating with a columnar microstructure and a branched columnar microstructure.

FIG. 3B illustrates a representative cross-section of another example article that has multiple first and second layers and a bond coating.

DETAILED DESCRIPTION

Figure 4:
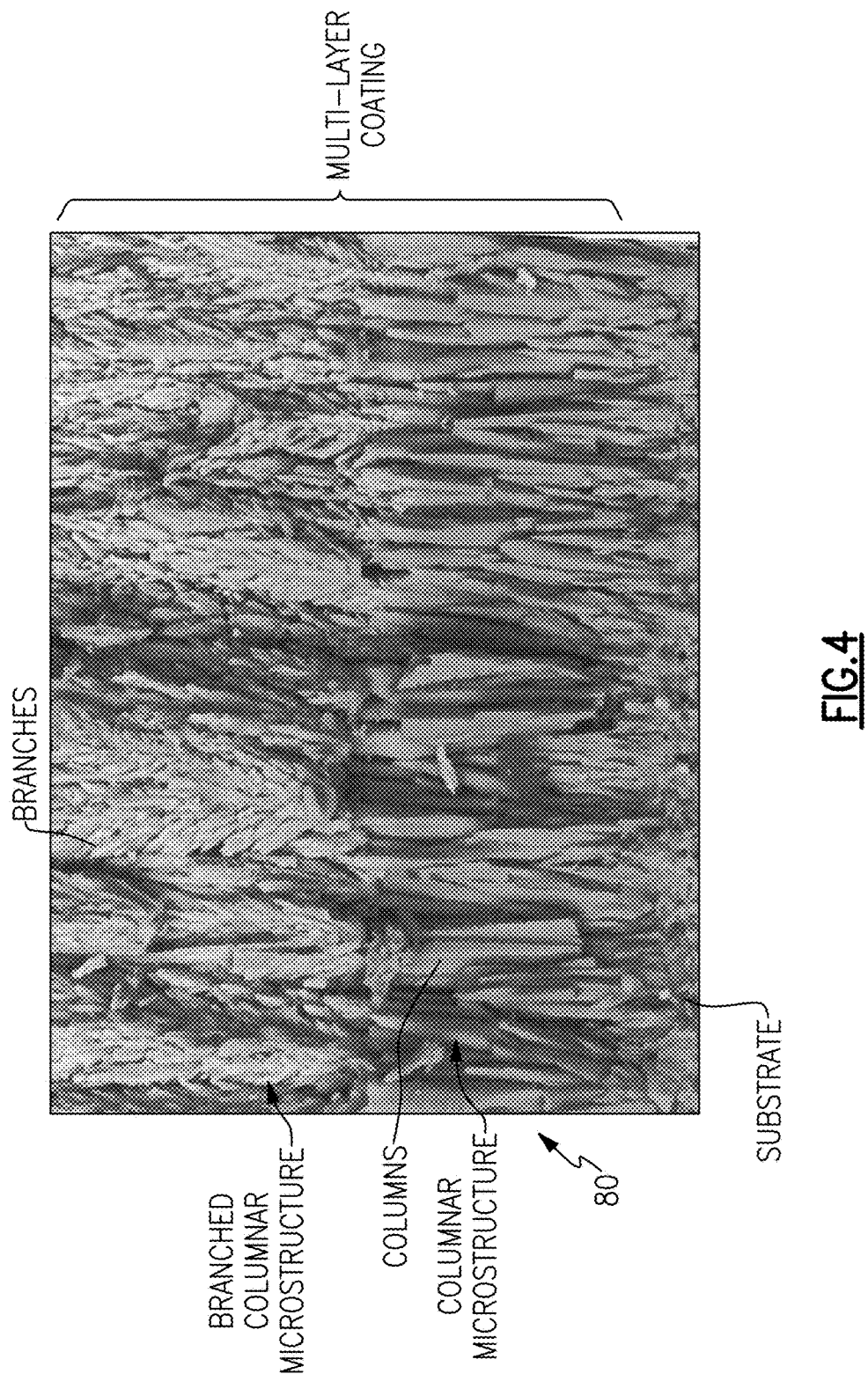
FIG. 4 illustrates a micrograph showing a columnar microstructure and a branched columnar microstructure.

FIG. 1 schematically illustrates a gas turbine engine 20. The gas turbine engine 20 is disclosed herein as a two-spool turbofan that generally incorporates a fan section 22, a compressor section 24, a combustor section 26 and a turbine section 28. Alternative engine designs can include an augmentor section (not shown) among other systems or features. Although depicted as a two-spool turbofan gas turbine engine, the examples herein are not limited to use with two-spool turbofans and may be applied to other types of turbomachinery, including direct drive engine architectures, three-spool engine architectures, and ground-based turbines that do not include a fan.

The fan section 22 drives air along a bypass flow path B in a bypass duct defined within a nacelle 15, while the compressor section 24 drives air along a core flow path C for compression and communication into the combustor section 26 then expansion through the turbine section 28.

The engine 20 generally includes a low speed spool 30 and a high speed spool 32 mounted for rotation about an engine central longitudinal axis A relative to an engine static structure 36 via several bearing systems 38. It should be understood that various bearing systems 38 may be used at various locations, and the location of bearing systems 38 may be varied as appropriate to the application.

The low speed spool 30 generally includes an inner shaft 40 that interconnects a fan 42, a first (or low) pressure compressor 44 and a first (or low) pressure turbine 46. The inner shaft 40 is connected to the fan 42 through a speed change mechanism, which in the gas turbine engine 20 of FIG. 1, is illustrated as a geared architecture 48, to drive the fan 42 at a lower speed than the low speed spool 30.

The high speed spool 32 includes an outer shaft 50 that interconnects a second (or high) pressure compressor 52 and a second (or high) pressure turbine 54. A combustor 56 is arranged between the high pressure compressor 52 and the high pressure turbine 54. A mid-turbine frame 57 of the engine static structure 36 is arranged generally between the high pressure turbine 54 and the low pressure turbine 46. The mid-turbine frame 57 further supports the bearing systems 38 in the turbine section 28. The inner shaft 40 and the outer shaft 50 are concentric and rotate via bearing systems 38 about the engine central longitudinal axis A, which is collinear with their longitudinal axes.

The core airflow is compressed by the low pressure compressor 44 then the high pressure compressor 52, mixed and burned with fuel in the combustor 56, then expanded over the high pressure turbine 54 and low pressure turbine 46. The mid-turbine frame 57 includes airfoils 59 which are in the core airflow path C. The turbines 46, 54 rotationally drive the respective low speed spool 30 and high speed spool 32 in response to the expansion. It will be appreciated that each of the positions of the fan section 22, compressor section 24, combustor section 26, turbine section 28, and fan drive gear system 48 may be varied. For example, gear system 48 may be located aft of combustor section 26 or even aft of turbine section 28, and fan section 22 may be positioned forward or aft of the location of gear system 48.

The engine 20 in one example is a high-bypass geared aircraft engine. In a further example, the engine 20 bypass ratio is greater than about six (6), with an example embodiment being greater than about ten (10), the geared architecture 48 is an epicyclic gear train, such as a planetary gear system or other gear system, with a gear reduction ratio of greater than about 2.3 and the low pressure turbine 46 has a pressure ratio that is greater than about five. It should be understood, however, that the above parameters are only examples of one embodiment of a geared architecture engine and that the present invention is applicable to other gas turbine engines, including direct drive turbofans.

FIG. 2 illustrates an example article 60 that can be used in a gas turbine engine, such as the gas turbine engine 20 of FIG. 1. In this example, the article 60 is an airfoil and, more specifically, an airfoil vane doublet for use in a turbine section, such as the turbine section 28 of the engine 20 of FIG. 1. Although the examples herein may be presented or described in the context of an airfoil or airfoils, other types articles may benefit from the examples, such as but not limited to, components in compressor sections, combustors, or turbine sections of gas turbine engines. Such examples can include airfoils, such as static vanes or rotatable blades, combustor panels, seals, valve components, and the like that are exposed to high temperatures, corrosive conditions, or combinations thereof. Additionally, the examples are not limited to gas turbine engine components, and may also include automotive components, such as piston crowns, exhaust valve faces, or other components that are exposed to elevated temperatures, corrosive conditions, or combinations thereof.

FIG. 3A illustrates a representative cross-section through a portion of the article 60, as indicated in FIG. 2. In this example, the article 60 includes a substrate 62 and a multi-layered ceramic barrier coating 64 on the substrate 62. For an airfoil, the substrate 62 defines the airfoil geometry and the multi-layered ceramic barrier coating 64 is supported on, and conforms with, the underlying geometry of the substrate 62. FIG. 3A shows one alternative example and is similar to FIG. 3A but includes a bond coating 63 below the multi-layered ceramic barrier coating 64 and additional layers in the multi-layered ceramic barrier coating 64. The bond coating 63 is between the substrate 62 and the multi-layered ceramic barrier coating 64, but additional or alternative bond coatings can be provided between layers of the multi-layered ceramic barrier coating 64.

The multi-layered ceramic barrier coating 64 includes, from the substrate 62 outward, a first layer 66 and a second layer 68. For example, in one non-limiting embodiment, the layers 66/68 are distinct from one another, are continuous, and are relatively uniform in thickness. In one example, the first layer 66 is formed of a first ceramic material and the second layer 68 is formed of a second ceramic material that differs from the first ceramic material in chemical composition. In a further non-limiting embodiment, the first layer 66 is formed of a low-dopant ceramic material and the second layer 68 is formed of a high-dopant ceramic material. Accordingly, the phrases "first or low-dopant ceramic material" and "second or high-dopant ceramic material" used herein refer to use of either first and second ceramic materials that have different compositions or to use of low- and high-dopant ceramic materials.

The low- and high-dopant ceramic materials may constitute the entirety of the respective layers 66/68, constitute substantially all of the respective layers 66/68, or may be distinct phases in one or both of the respective layers 66/68. The terms "low" and "high" used with reference to the dopant in the ceramic materials refer to the amounts of the dopant elements relative to each other. In a further example, the "low" and "high" amounts may differ, in weight percent in the respective layers, by at least 10%. In one embodiment, the low-dopant ceramic material may be yttria stabilized zirconia that includes approximately 7 wt % yttria and the high-dopant ceramic material may be gadolinia stabilized zirconia that includes approximately 59 wt % gadolinia. Thus, the difference between the "low" and "high" amounts of dopant in this example would be approximately 52%. In further examples, the "low" and "high" amounts may differ by at least 20%, by at least 30%, or by at least 50%. In additional examples, the "low" and "high" amounts may differ by at least 10% to 90% or by at least 50% to 90%.

As schematically shown, the first layer 66 has a columnar microstructure 70, and the second layer 68 has a branched columnar microstructure 72. The branched columnar microstructure 72 may also be referred to as a "feathered" or "feather-like" microstructure. Structurally, the columnar microstructure 70 includes a plurality of well-defined crystallized columns 70a. For instance, the columns 70a are substantially non-branched and are oriented with their axial direction vertical to or perpendicular to a localized surface 62a of the substrate 62. The branched columnar microstructure 72 includes branched columns 72a that generally extend vertical to or perpendicular to the localized surface 62a of the substrate 62 directly underneath the respective column 72a. The branched columns 72a include relatively smaller branch portions or cells 72b that generally extend at an oblique angle to the perpendicular or vertical direction relative to the localized surface of the substrate 62. For instance, the angle formed between the branches 72b and column 72a is acute (opening outwardly).

The differing microstructures 70/72 provide the multi-layered ceramic barrier coating 64 with a combination of characteristics. The characteristics may be further enhanced or modified through selection of the chemical composition (s) of the ceramic materials. In one example, the ceramic materials are independently doped with elements selected from rare earth elements. The rare earth elements, in some embodiments, include the lanthanide elements, scandium, and yttrium.

In one further example, the ceramic materials are oxides and are doped with one or more rare earth elements. For instance, the oxides may be independently selected from zirconia or hafnia. In further examples, the ceramic materials may include a dopant of either yttrium or gadolinium, which is in the form either yttria or gadolinia. For instance, in a non-limiting embodiment, a low-dopant ceramic material of the first layer 66 is yttria stabilized zirconia (YSZ) and a high-dopant ceramic material of the second layer 68 is gadolinia stabilized zirconia (GSZ). One example of YSZ includes approximately 7 wt % yttria, and one example of GSZ includes approximately 59 wt % gadolinia.

In one modification, rather than zirconia, one or both of the ceramic materials may include hafnium, which is in the form of a hafnate (hafnia). As in the examples above, the hafnate may also be doped with one or more of the rare earth elements.

In a further example, the first layer 66 may have, by volume percent, a first porosity and the second layer 68 may have a second porosity that is different from the first porosity. In one example, the second porosity may be greater than the first porosity. The differing porosities are the result of processing and composition. The higher porosity of the second layer 68 provides lower thermal conductivity and a more tortuous pathway for infiltration of outside substances, such as but not limited to, ash, dust, sand and/or other materials that at relatively high temperatures can form calcium-magnesium alumino-silicate (CMAS). The lower porosity of the first layer 66 provides relatively higher strength and better resistance to strain relative to the higher porosity second layer 68. Thus, the first layer 66 can provide the multi-layered ceramic barrier coating 64 with strength and strain resistance, while the second layer 68, which may be directly exposed to the external environment, can provide thermal and environmental resistance.

In a further example, due to internal porosity and microstructure, the first layer 66 has a first internal surface area and the second layer 68 has a second internal surface area that is different from the first internal surface area. In one example, the second internal surface area may be greater than the first internal surface area. The differing internal surface areas are the result of the porosities provided by the differing microstructures. For example, the branched columnar microstructure 72 may have a greater internal surface area than the columnar microstructure 70 because of additional surface area of the branch portions or cells 72b. In further examples, the internal surfaces areas may differ by 10%, 20%, or more.

In FIG. 3A, the first layer 66 and the second layer 68 are in contact with each other, and the first layer 66 is in contact with the substrate 62. Thus, the multi-layered ceramic barrier coating 64 is an exclusive dual-layer coating.

In other examples, as shown for example in FIG. 3B, one or more bond coats 63 may be provided between the first layer 66 and the substrate 62 to enhance bonding therebetween. The example in FIG. 3B also includes multiple first layers 66 and multiple second layers 68. Although this example has two of the first layers 66 and two of the second layers 68 in an alternating arrangement, it is to be understood that additional first layers 66 and second layers 68 could be used. Additionally or alternatively, one or more additional layers may be provided between the first layers 66 and the second layers 68. The additional layer or layers may be bonding layers that are structured and/or formulated to facilitate bonding. Such bonding layers may have the same or similar columnar microstructure 70 and/or the same or similar branched columnar microstructure 72

FIG. 4 illustrates a micrograph 80 that shows an example cross-section with an actual substrate, actual columnar microstructure, and actual branched columnar microstructure.

Figure 5:
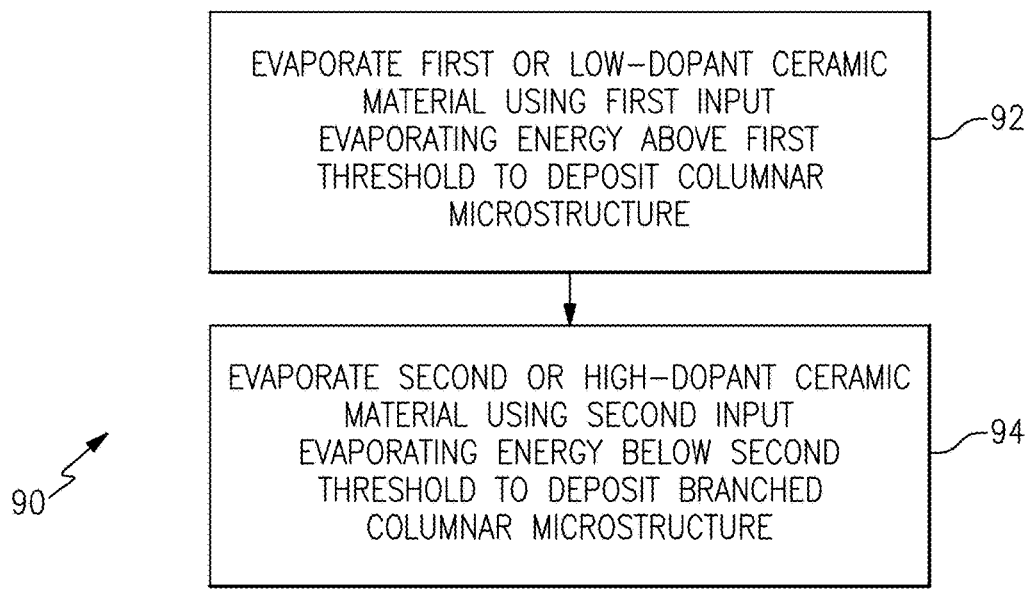
FIG. 5 illustrates an example method of forming a multi-layered ceramic barrier coating.

FIG. 5 illustrates an example method 90 of forming a coating as in the examples described above. For instance, the method 90 may be employed to form the first layer 66 and the second layer 68 of the multi-layered ceramic barrier coating 64, shown in FIG. 3A, FIG. 3B, and FIG. 4. The layers 66/68 are deposited in a coating apparatus using a high pressure electron beam physical vapor deposition (EB-PVD) technique. The coating apparatus can include one or more coating chambers, one or more perforated process gas supply tubes in the chambers for controlling pressure, at least one electron beam gun, at least one crucible for each of the ceramic materials, one or more thermocouples for measuring temperature, such as at or near the work pieces, one or more fixtures for holding/rotating workpieces, and pumps, gas sources, and valves for controlling the internal environment in the one or more coating chambers. One or more controllers that include hardware, software, or both may be employed to manage operation of the coating process according to the method 90. More typically, the coating apparatus may have a plurality of crucibles for each material and a plurality of electron beam guns that operate in coordination according to the method 90 described herein.

In one example, the electron beam gun or guns are configured for high-acceleration. A conventional electron beam gun may run at 20 to 40 kV, which is sufficient in low pressure conditions to deliver electrons with minimal scattering loss due to process gas. In a high pressure regime, discussed in further detail below, higher acceleration voltage is used to reduce scattering by the process gas (since there is a greater of it, per volume, at higher pressure). In one example, the gun voltage for the high pressure regime may be greater than 60 kV, and in a further example is 80 kV. A high-acceleration electron beam gun may be run at lower internal vacuum, which requires vacuum pumping of the gun chambers and/or other means to reduce back-streaming of process gas into the gun.

In one further example, the coating apparatus includes at least two distinct coating chambers that are separated by a gate valve. One of the chambers is used for depositing one of the ceramic materials and the other chamber for depositing the other of the ceramic materials. The gate valve environmentally separates the chambers and reduces co-deposition of the materials and cross-contamination of the chambers. The gate valve can be selectively opened/closed to transfer work pieces between the chambers on a transport fixture.

A conventional EB-PVD process for thermal barrier coatings is conducted under low vacuum conditions that are substantially less than 0.067 Pascals (5×10-4 torr). However, the method 90 for depositing the ceramic materials disclosed herein is conducted in a high pressure regime of greater than 1 Pascals (75×10-4 torr). For example, the chamber pressure is from 1 Pascals to 15 Pascals (11×10-2 torr) and, in a further example, is from 3 Pascals to 6 Pascals. The process gas may include oxygen. In one example the process gas includes pure or substantially pure oxygen. In another embodiment, the process gas includes oxygen and an inert gas, such as argon, helium, or mixtures thereof. The pressure of greater than 1 Pascals may be constant during deposition of one or both of the ceramic materials. Alternatively, the pressure may be varied above the 1 Pascal level during deposition of one or both or the ceramic materials. If multiple chambers are used, each of the multiple chambers may be operated according to the above conditions.

Figure 6:
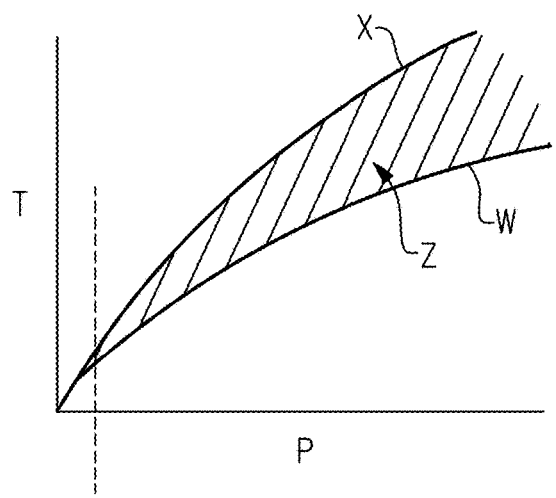
FIG. 6 illustrates a graph of threshold trend lines for a low-dopant ceramic material and a high-dopant ceramic material.

In low pressure regimes the ceramic materials behave similarly with respect to the deposited microstructures. That is, under common process input parameters in the low pressure regime, the ceramic materials, such as zirconia or hafnia ceramic materials, deposit with the same microstructure. However, as schematically represented in FIG. 6, the deposition behaviors of the materials deviate in high pressure regimes. The vertical dashed line represents the pressure regime boundary. To the left of the dashed line is the low pressure regime and to the right is the high pressure regime.

Graph line W represents a microstructural temperature-pressure threshold for deposition of the first or low-dopant ceramic material, and graph line X represents a microstructural temperature-pressure threshold for deposition of a second or high-dopant ceramic material. For deposition input parameters that fall above the threshold X for the second or high-dopant ceramic material, the microstructure is columnar, and for deposition input parameters that fall below the threshold X the microstructure is branched columnar. Similarly, for deposition input parameters that fall above the threshold W for the first or low-dopant ceramic material, the microstructure is columnar and for deposition input parameters that fall below the threshold W the microstructure is branched columnar. Thus, there is a temperature and pressure envelope, Z, in the high pressure regime vertically between the two thresholds X and W where the deposition of temperature and pressure input parameters effectuate deposition of the first or low-dopant ceramic material in the columnar microstructure and deposition of the second or high-dopant ceramic material in the branched columnar microstructure.

Although the graph shows temperature versus pressure, the difference in the deposition behaviors relates to input evaporating energy, which may also correspond to surface diffusion rates of the ceramic materials. Input evaporating energy is the amount of energy of the electron beams (from one or more electron beam guns) that impinges on the ceramic materials and corresponds to the energy level of the evaporant gas. In essence, higher energy levels, and corresponding higher rates of surface diffusion, are thought to be required to deposit the materials in the columnar microstructure. Lower energy levels, and corresponding lower rates of surface diffusion, result in the branched columnar microstructure. Higher deposition temperatures may increase energy levels; however, increasingly higher temperatures can damage deposition equipment and the articles that are being coated. In this regard, rather than utilizing temperature alone to increase evaporant energy, the method 90 utilizes controlled input evaporating energies in order to deposit the ceramic materials in, respectively, the columnar and branched columnar microstructures.

For purpose of description the method 90 is shown in two steps, including step 92 and step 94. The steps 92/94 will typically be performed sequentially to first deposit the first layer 66 and, upon completion of the deposition of the first layer 66, to deposit the second layer 68. However, in modified examples, the order of the steps may be reversed and/or one or both of the steps 92/94 may be repeated to produce additional first and/or second layers 66/68 or even alternating layer arrangements (see FIG. 3B). Additional steps, such as application of bond coatings or other layers as described above, may be performed, before or after either of steps 92/94.

The steps 92/94 are conducted under a chamber pressure of greater than 1 Pascals, i.e., in the high pressure regime. Step 92 includes evaporating the first or low-dopant ceramic material using a first input evaporating energy that falls above the temperature and pressure threshold W for depositing the first or low-dopant ceramic material in the columnar microstructure 70 rather than in a branched columnar microstructure. Thus, the evaporated first or low-dopant ceramic material deposits on the substrate 62 as the first layer 66 with the columnar microstructure 70.

Step 94 includes evaporating the second or high-dopant ceramic material using a second input evaporating energy that falls below the temperature and pressure threshold X for depositing the second or high-dopant ceramic material in the branched columnar microstructure 72 rather than in a columnar microstructure. Thus, the evaporated second or high-dopant ceramic material deposits on the substrate 62 as the second layer 68 with the branched columnar microstructure 72. As will be appreciated, the steps 92/94 may be performed in a single common chamber or in different chambers.

In some embodiments, the first and second input evaporating energies may be equal, although the ultimate surface diffusion rates of the ceramic materials are unequal and result in the differing microstructures. Further, in some embodiments, one or both of the first and second input evaporating energies may fall within the area Z vertically between the two temperature and pressure thresholds W and X in FIG. 6.

The input evaporating energies can be controlled and selected through modulation of percentage of electron beam power that is directed onto the ceramic materials. For example, the evaporating of the first or low-dopant ceramic material can include modulating a (first) percentage of an electron beam power that is on a pool 98 of the first or low-dopant ceramic material to produce the first input evaporating energy. For the deposition of the second or high-dopant ceramic material, the evaporating can also include modulating a (second) percentage of the electron beam power that is on a pool of the second or high-dopant ceramic material to produce the second input evaporating energy. As an example, the first and second percentages may be equal, which permits a single set of process input parameters to be used to deposit both of the ceramic materials.

Figure 7:
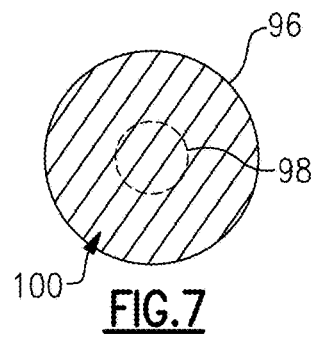
FIG. 7 illustrates an electron beam footprint at least partially overlapping a melt pool.

The percentages of electron beam power that are directed onto the respective pools can be changed or modulated by adjusting electron beam gun parameters. For example, the electron beam gun parameters include electron beam focus and electron beam pattern zoom. In electron beam pattern zoom, the beam itself is unchanged but the pattern it rasters over changes with increasing or decreasing zoom. The adjusting of the electron beam gun parameters produces an electron beam footprint (area), represented at 96 in FIG. 7, which is used to evaporate the first or low-dopant ceramic material. The electron beam footprint may have a particular size and geometry and is located to at least partially overlap the pool of the first or low-dopant ceramic material by an amount that corresponds to the first percentage. Likewise, for the evaporating of the second or high-dopant ceramic material, an electron beam footprint is located to at least partially overlap the pool of the second or high-dopant ceramic material by an amount that corresponds to the second percentage. Again, for a single common set of process input parameters, the electron beam footprint and amount of overlap may be equal for both ceramic materials.

In a further example, the input evaporating energies are also controlled with respect to process temperature. The process temperature may be a temperature at or near the work piece(s) being coated. Such temperature may be measured with one or more thermocouples positioned at or near the work piece(s). The thermocouple(s) may be in or on tooling that is at or near the work piece(s). The temperature readings may be used directly or used to predict, estimate, or calculate temperature of the work piece(s). For instance, for a selected electron beam focus and electron beam pattern zoom that produces the electron beam footprint, the amount of overlap with the given pool can be varied in order to adjust the amount of energy used to melt the ceramic materials versus the amount of energy that is not directed at the pool(s) that heats the chamber. Again, for a single common set of process input parameters, the selected chamber pressure and the selected process temperature may be substantially constant for evaporating the both ceramic materials.

As mentioned in the prior examples, a single common set of process input parameters may be used to deposit the ceramic materials. In that regard, the method 90 can include using a common set of input parameters that at least includes common electron beam power and common chamber pressures of greater than 1 Pascal, e.g., falling within the area Z shown in FIG. 6. In further examples, the common set of input parameters also includes one or more of common input evaporating energies, common percentage of the electron beam power that is on the pools, and common amount of footprint overlap on the pools.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is for illustrative and descriptive purposes, rather than limiting in nature. Variations and modifications to the disclosed examples may become apparent to those skilled in the art that do not necessarily depart from this disclosure. The scope of legal protection given to this disclosure can only be determined by studying the following claims.

What is claimed is:

1. A method of forming a multi-layered ceramic barrier coating, the method comprising:
under a chamber pressure of greater than 1 Pascals, evaporating a low-dopant ceramic material using a first input evaporating energy that is above a threshold for depositing the low-dopant ceramic material in a low-dopant ceramic columnar microstructure versus a low-dopant ceramic branched columnar microstructure, the evaporated low-dopant ceramic material depositing on a substrate as a first layer that has the low-dopant ceramic columnar microstructure, the low-dopant ceramic material having a first amount of dopant; and under the chamber pressure of greater than 1 Pascal, evaporating a high-dopant ceramic material using a second input evaporating energy that is below a threshold for depositing the high-dopant ceramic material in a high-dopant ceramic columnar microstructure versus a high-dopant ceramic branched columnar microstructure, the evaporated high-dopant ceramic material depositing on the substrate as a second layer that has the high-dopant ceramic branched columnar microstructure, the high-dopant ceramic material having a second amount of dopant higher than the first amount of dopant in the low-dopant ceramic material.

2. The method as recited in claim 1, wherein the evaporating of the low-dopant ceramic material includes modulating a first percentage of an electron beam power that is on a pool of the low-dopant ceramic material to produce the first input evaporating energy, and the evaporating of the high-dopant ceramic material includes modulating a second percentage of the electron beam power that is on a pool of the high-dopant ceramic material to produce the second input evaporating energy.

3. The method as recited in claim 2, wherein the modulating of the first percentage and the modulating of the second percentage include adjusting an electron beam focus and an electron beam pattern zoom.

4. The method as recited in claim 3, wherein the adjusting includes producing an electron beam footprint, and for the evaporating of the low-dopant ceramic material, partially overlapping the electron beam footprint with the pool of the low-dopant ceramic material by an amount that corresponds to the first percentage, and for the evaporating of the high-dopant ceramic material, partially overlapping the electron beam footprint with the pool of the high-dopant ceramic material by an amount that corresponds to the second percentage.

5. The method as recited in claim 4, wherein the first percentage and the second percentage are equal.

6. The method as recited in claim 2, further comprising controlling the first input evaporating energy and the second input evaporating energy with respect to process temperature.

7. The method as recited in claim 1, wherein the chamber pressure is 3-15 Pascals.

8. The method as recited in claim 1, wherein the chamber pressure and a process temperature are constant for evaporating the low-dopant ceramic material and evaporating the high-dopant ceramic material.

9. The method as recited in claim 1, wherein the low-dopant ceramic material and the high-dopant ceramic material are oxides that are independently doped with elements selected from the group consisting of rare earth elements.

10. The method as recited in claim 1, wherein the substrate is a substrate of a gas turbine engine component.

11. A method of forming a multi-layered ceramic barrier coating, the method comprising:
using a common set of electron beam physical vapor deposition input parameters that at least includes common electron beam power and common chamber pressure of greater than 1 Pascals,
evaporating a low-dopant ceramic material and depositing the evaporated low-dopant ceramic material on a substrate, wherein the common set of electron beam physical vapor deposition input parameters effectuate deposition of the low-dopant ceramic material in a columnar microstructure, the low-dopant ceramic material having a first amount of dopant, followed by,
evaporating a high-dopant ceramic material and depositing the evaporated high-dopant ceramic material on the substrate, wherein the common set of electron beam physical vapor deposition input parameters effectuate deposition of the high-dopant ceramic material in a branched columnar microstructure, the high-dopant ceramic material having a second amount of dopant higher than the first amount of dopant in the low-dopant ceramic material.

12. The method as recited in claim 11, wherein the low-dopant ceramic material and the high-dopant ceramic material are independently doped with elements selected from the group consisting of rare earth elements.

13. The method as recited in claim 11, wherein the low-dopant ceramic material and the high-dopant ceramic material each include zirconium.

14. The method as recited in claim 13, wherein the low-dopant ceramic material includes yttrium and the high-dopant ceramic material includes gadolinium.

15. The method as recited in claim 13, wherein the low-dopant ceramic material is yttria stabilized zirconia and the high-dopant ceramic material is gadolinia stabilized zirconia.

16. The method as recited in claim 13, wherein the substrate is a substrate of a gas turbine engine component.

17. The method as recited in claim 13, further comprising applying a bond coating to at least one of the substrate, the low-dopant ceramic material, or the high-dopant ceramic material.

18. A method of forming a multi-layered ceramic barrier coating, the method comprising:
under a chamber pressure of greater than 1 Pascals, evaporating a first ceramic material above a first temperature-pressure threshold for depositing the first ceramic material in a first columnar microstructure versus a first branched columnar microstructure, the evaporated first ceramic material depositing on a substrate as a first layer that has the first columnar microstructure; and
under the chamber pressure of greater than 1 Pascal, evaporating a second ceramic material below a second temperature-pressure threshold for depositing the second ceramic material in a second columnar microstructure versus a second branched columnar microstructure, the second ceramic material differing from the first ceramic material in composition and the evaporated second ceramic material depositing on the substrate as a second layer that has the second branched columnar microstructure.

19. The method as recited in claim 18, wherein the first ceramic material and the second ceramic material are oxides that are independently doped with elements selected from the group consisting of rare earth elements.

20. The method as recited in claim 19, wherein the oxides are selected from the group consisting of zirconia and hafnia.

* * * * *